US 9,594,266 B1

(12) United States Patent
Brener et al.

(10) Patent No.: US 9,594,266 B1
(45) Date of Patent: Mar. 14, 2017

(54) TUNEABLE PHOTONIC DEVICE INCLUDING AN ARRAY OF METAMATERIAL RESONATORS

(71) Applicant: Sandia Corporation, Albuquerque, NM (US)

(72) Inventors: Igal Brener, Albuquerque, NM (US); Michael Wanke, Albuquerque, NM (US); Alexander Benz, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 393 days.

(21) Appl. No.: 14/183,261

(22) Filed: Feb. 18, 2014

(51) Int. Cl.
| | |
|---|---|
| H01L 31/0352 | (2006.01) |
| G02F 1/00 | (2006.01) |
| H01S 5/34 | (2006.01) |
| G02F 1/017 | (2006.01) |
| G02F 1/21 | (2006.01) |
| H01L 29/778 | (2006.01) |
| B82Y 20/00 | (2011.01) |
| H01Q 15/00 | (2006.01) |

(52) U.S. Cl.
CPC .............. *G02F 1/017* (2013.01); *B82Y 20/00* (2013.01); *G02F 1/218* (2013.01); *H01L 29/7783* (2013.01); *H01L 31/035236* (2013.01); *H01Q 15/0086* (2013.01); *H01S 5/3402* (2013.01)

(58) Field of Classification Search
CPC ............ H01Q 15/0086; H01L 29/7783; H01L 31/035236; G02F 1/017; B82Y 20/00; H01S 5/3402
See application file for complete search history.

(56) References Cited

U.S. PATENT DOCUMENTS

| | | | | |
|---|---|---|---|---|
| 4,899,200 | A * | 2/1990 | Shur | H01L 27/1443 257/194 |
| 7,106,494 | B2 | 9/2006 | Osipov et al. | |
| 7,457,338 | B2 * | 11/2008 | Mawst | B82Y 20/00 257/E33.008 |
| 7,570,409 | B1 | 8/2009 | Wang et al. | |
| 7,826,504 | B2 | 11/2010 | Chen et al. | |
| 9,018,642 | B1 * | 4/2015 | Brener | G02F 1/015 257/1 |
| 9,086,510 | B1 * | 7/2015 | Brener | G02B 1/002 |
| 2002/0131458 | A1 * | 9/2002 | Sirbu | B82Y 20/00 372/20 |

(Continued)

OTHER PUBLICATIONS

Benz et al., "Strong coupling in the sub-wavelength limit using metamaterial nanocavities", Nature Comm., pp. 1-8 (2013).
Benz et al., "Monolithic metallic nanocavities for strong light-matter interaction to quantum-well intersubband excitations", Opt. Express 21(26), pp. 32572-32581 (2013).
Chan, W. et al., "A spatial light modulator for terahertz beams", App. Phys. Lett. 94, 213511 (2009).
Chen, H. et al., "Active terahertz metamaterial devices", Nature 444, pp. 597-600 (2006).
Chen, H. et al., "A metamaterial solid-state terahertz phase modulator", Nature Photonics 3, pp. 148-151 (2009).
Chen, H., et al., "Experimental demonstration of frequency agile terahertz metamaterials", Nature Photonics 2, pp. 295-298 (2008).
Gabbay and Brener, "Theory and modeling of electrically tunable metamaterial devices using inter-subband transitions in semiconductor quantum well", Opt. Express, 20(6), pp. 6584-6597 (2012).
Peralta, X.G. et al., "External modulators for terahertz quantum cascade lasers based on electrically driven active metamaterials", Metamaterials (Amst.) 4(2-3), pp. 83-88 (2010).

*Primary Examiner* — Marvin Payen
*Assistant Examiner* — Jeremy Joy
(74) *Attorney, Agent, or Firm* — Martin I. Finston (57) ABSTRACT

A photonic apparatus includes a metamaterial resonator array overlying and electromagnetically coupled to a vertically stacked plurality of quantum wells defined in a semiconductor body. An arrangement of electrical contact layers is provided for facilitating the application of a bias voltage across the quantum well stack. Those portions of the semiconductor body that lie between the electrical contact layers are conformed to provide an electrically conductive path between the contact layers and through the quantum well stack.

17 Claims, 4 Drawing Sheets

(56) References Cited

U.S. PATENT DOCUMENTS

| | | | |
|---|---|---|---|
| 2007/0289623 A1* | 12/2007 | Atwater | B82Y 20/00 136/252 |
| 2008/0267243 A1* | 10/2008 | Wang | H01S 5/50 372/69 |
| 2009/0262766 A1* | 10/2009 | Chen | H03C 7/027 372/26 |
| 2011/0175672 A1* | 7/2011 | Nguyen | G02B 1/002 327/534 |
| 2011/0286486 A1* | 11/2011 | Fujita | B82Y 20/00 372/45.01 |
| 2013/0307108 A1* | 11/2013 | Nakajima | G02B 1/005 257/432 |
| 2014/0211298 A1* | 7/2014 | Sayyah | H01P 7/082 359/298 |
| 2014/0241392 A1* | 8/2014 | Edamura | H01S 5/3402 372/45.012 |

\* cited by examiner

TUNEABLE PHOTONIC DEVICE INCLUDING AN ARRAY OF METAMATERIAL RESONATORS

STATEMENT REGARDING FEDERALLY SPONSORED RESEARCH OR DEVELOPMENT

This invention was developed under Contract DE-AC04-94AL85000 between Sandia Corporation and the U.S. Department of Energy. The U.S. Government has certain rights in this invention

FIELD OF THE INVENTION

The invention relates to photonic devices, and more particularly to optical filters and modulators that incorporate arrays of metamaterial resonators.

ART BACKGROUND

A metamaterial is a composite structure intended to interact resonantly with electromagnetic radiation at certain wavelengths and composed by individual, typically repeating, units of subwavelength dimensions, whose geometry defines the resonances. Metamaterials are of great interest because they offer the possibility to control and manipulate light in ways that are not achievable using natural materials. The term "light" in this regard is meant to include electromagnetic radiation throughout, among others, the infrared and visible portions of the spectrum.

Various authors have proposed the use of metamaterials for the filtering and modulation of electromagnetic radiation. It has been suggested that metamaterial structures can be scaled for operation in a broad spectral range extending from radio to visible frequencies.

One useful feature of a photonic device such as a filter or modulator is the capacity for dynamic tuning Tuning with an applied voltage is especially desirable, because voltage tuning is generally effective at greater frequencies than thermal and mechanical tuning, and it generally requires less complex circuitry than optical tuning.

Voltage-tunable metamaterial filters have in fact been proposed. For example, it has been known for some time that the metamaterial resonances can be very sensitive to the background dielectric properties of the underlying substrate. Accordingly, one approach has been to form the metamaterial structure on a doped semiconductor substrate, and to apply a reverse bias to deplete the carriers in a surface region near the metamaterial. The resulting change in the dielectric properties of the substrate in turn modifies the resonant behavior of the metamaterial.

Although useful for frequencies in the terahertz (THz) regime or lower, such an approach is not easily scaled to the mid-infrared (MIR) spectral range. One reason is that to be effective, the operative part of the semiconductor substrate would need to exhibit a free-carrier plasma frequency in the MIR range. That could only be done at extremely high carrier concentrations. However, such high carrier densities would limit the depletion region achievable by reverse biasing to an extremely thin layer that in most cases would interact too weakly to provide a useful amount of tuning.

More recently, a mechanism based on inter-subband transitions (ISTs) has been proposed for the voltage tuning of metamaterial structures. It is well known that a homogeneous crystalline semiconductor exhibits a band structure in which one or more valence bands of carrier energy are separated from one or more conduction bands by energy gaps. It is also well known that semiconductors can be engineered to exhibit, at desired levels, accessible energy states that lie within the band gaps. Such energy states are examples of sub-bands. Optical transitions between those sub-bands are examples of ISTs.

The specific ISTs that have been proposed for exploitation in metamaterial devices are transitions between bound states of quantum wells. Skilled artisans have known for many years that a thin epitaxial semiconductor layer of relatively low bandgap enclosed between higher-bandgap layers can define a potential well that can capture electrons. The captured electrons exhibit bound states that typically include a ground state and one or more excited states. Analogous quantum wells for holes are also feasible.

The resonant behavior of a metamaterial resonator (MMR) can be very sensitive to the nearby presence of populated quantum wells. In particular, the respective optical excitations of the MMR and a quantum well can strongly couple, via dipole interactions, when the resonant wavelength of the MMR approaches the absorption wavelength for a transition between bound states of the quantum well. In that circumstance, it is common to encounter "anti-crossing behavior", in which the respective excitations hybridize so that neither of them is wholly of MMR character or wholly of quantum-well character.

Instead of crossing when the MMRs and quantum wells are tuned toward each other, the energies of the hybrid excitations, which are often referred to as "polaritons", exhibit anti-crossing behavior. That is, as the MM and IST transition energies are tuned in an attempt to make them mutually resonant, their interaction results in a minimum, but non-zero, energy separation at the point where they would resonate with each other, absent the interaction. As a consequence, the feature consisting of a pair of polariton peaks appears near resonance when the individual MMR and quantum well resonances (at least approximately) coincide, but it is absent when the individual resonances are well separated. Given a tuning mechanism for controllably bringing the respective resonances into and out of coincidence, this phenomenon could be exploited for photonic control applications.

Such a scheme for electrical tuning of planar metamaterials has in fact been proposed. For example, A. Gabbay and I. Brener, "Theory and modeling of electrically tunable metamaterial devices using inter-subband transitions in semiconductor quantum wells," *Optics Express*, Vol. 20, No. 6 (12 Mar. 2012) 6584-6597, presents a general scheme for electrically tunable metamaterial devices using ISTs in quantum wells as the substrate on which the metamaterial resonators are fabricated. The same article presents the results obtained through numerical simulation of an MMR array coupled to a stack of quantum well units, in which each unit consisted of a pair of asymmetric coupled gallium arsenide (GaAs) quantum wells separated by aluminum gallium arsenide (AlGaAs) barriers and enclosed between AlGaAs layers.

Electrical tuning was achieved by exploiting the quantum confined Stark effect. That is, the simulations indicated that application of a bias voltage would be able to shift the energies of the ISTs of the coupled quantum wells enough to achieve a useful tuning range. For example, modeling of a single coupled pair of quantum wells predicted that the ground state to first excited state transition could be tuned over a range of about sixty millielectron volts (60 meV) with a biasing electric field strength ranging from −70 to +70 kV/cm. Similarly, simulation of a metamaterial array coupled to a stack of 25 quantum-well pairs showed a tuning range in the quantum well resonance of about 23-32 THz (i.e. an infrared wavelength of 10.9±1.8 μm) for the same range of the biasing field.

Although approaches of the kind reported in Gabbay and Brener (2012) show promise, they have until now suffered the drawback of a very shallow interaction depth between the MMR array and the underlying quantum well stack, because of screening of the bias field by the first highly doped quantum wells. As a consequence, only a few layers in the quantum well stack have an appreciable effect on the spectral behavior of the device. This, in turn, tends to limit the contrast ratio, or modulation depth, that can be achieved when the device is operated as an optical amplitude modulator or tunable filter.

Thus, there remains a need for improved electrically tunable, resonant metamaterial photonic devices that can achieve greater modulation depths or spectral shifts, particularly for operation at infrared wavelengths.

SUMMARY OF THE INVENTION

We have developed such a device. Accordingly, we will describe, below, an example of an electrically tunable metamaterial photonic device capable with suitable design parameters of operation not only in the far infrared and long-wavelength infrared spectral ranges, but also in the mid-infrared spectral range.

As explained above, our device combines intersubband transitions in semiconductor quantum wells with planar metamaterials. The resonance frequency of the intersubband transition is controlled by an external bias relative to the fixed metamaterial resonance. This facilitates dynamic switching from an uncoupled to a strongly coupled resonant system. In experiments, we successfully used Stark tuning to shift the quantum well resonance (more accurately, the higher-energy polariton resonance of the coupled system) by 2.5 THz, corresponding to 8% of the center frequency or one full linewidth, with a bias of only 5 V.

In the course of our research, we discovered that due to a screening effect in the topmost one or several quantum wells, i.e. those nearest the MMR array, the applied bias voltage in previous devices leads only to an electric field close to the surface so that deeper-lying quantum wells do not experience the biasing field.

We found that this problem could be alleviated if, in contrast to the previous devices, a conductive path is provided for current flow across the quantum wells. The ohmic losses caused by the current passing through the semiconductor tend to stabilize the internal electric field and can lead to a homogenous voltage drop along the entire heterostructure.

Accordingly, the invention in one embodiment is a photonic apparatus comprising a metamaterial resonator array overlying and electromagnetically coupled to a vertically stacked plurality of quantum wells defined in a semiconductor body. An arrangement of electrical contact layers is provided for facilitating the application of a bias voltage across the quantum well stack. Those portions of the semiconductor body that lie between the electrical contact layers are conformed to provide an electrically conductive path between the contact layers and through the quantum well stack.

In more specific embodiments, the arrangement of electrical contact layers includes a doped semiconductor contact layer formed on a surface of the semiconductor body opposite to the metamaterial resonator array.

An embodiment of the invention in a second aspect is a method for operating a photonic device. The method includes impinging a light beam on a planar metamaterial resonator (MMR) array that overlies a quantum-well stack, and applying to the device a bias voltage effective to cause an electric current to flow through the quantum well stack. The method further includes, while flowing the current, varying the bias voltage so as to change a spectral transmission or reflection response of the MMR array.

BRIEF DESCRIPTION OF THE DRAWINGS

FIG. 2 provides a plot of a static current-voltage characteristic measured on a sample of a quantum well heterostructure. An inset to the figure provides a plot of the band structure according to a self-consistent calculation assuming biasing fields of −20 kV/cm and −40 kV/cm. The calculated band structure is included for pedagogical purposes, and in that regard should be understood as an idealization not directly comparable to experimental results. For example, there could be nonuniformities of various kinds in the voltage drop across the device that are not considered in the theoretical calculation.

FIG. 3a provides a calculated normal-incidence reflectance spectrum, at zero bias, of an exemplary device according to an embodiment of the invention. The spectrum is derived from finite-difference time-domain simulations. The bare cavity resonance, which is determined by the MMR geometry, varies continuously along the horizontal axis. The frequency is plotted along the vertical axis. The third dimension of the plot, shown here by greyscale contours, represents the reflectance of the device. The pair of dashed lines in the plot represent the predicted polariton eigenfrequencies, which correspond to minima in the reflectance.

FIG. 4 provides an experimentally measured normal-incidence reflectance spectrum plotted as a function of applied bias. Bias is plotted along the horizontal axis, frequency is plotted along the vertical axis, and reflectance is represented by greyscale contours. For comparison, the inset to the figure shows calculated reflectance spectra that were derived from numerical simulations. Plots added to the right of the main figure provide detailed cuts through the contour plot at biases of 0 V and 4 V as indicated by respective dashed vertical lines added to the main figure.

The 4 V spectrum also includes a vertical dotted line to indicate the position of the fundamental metamaterial resonance at zero bias.

DETAILED DESCRIPTION

Figure 1:
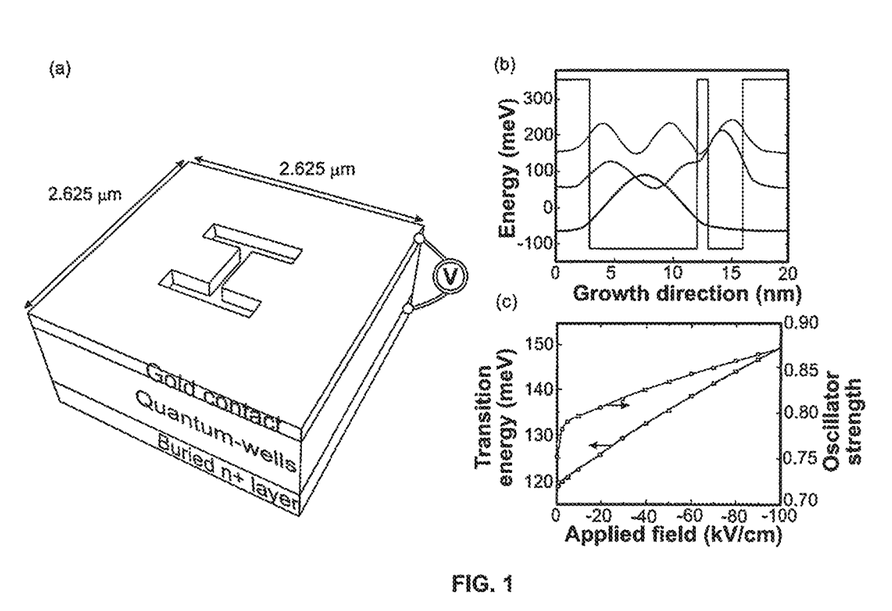
FIG. 1a provides a schematic view of a single unit cell of a metamaterial resonator (MMR) array according to the invention in an exemplary embodiment.
FIG. 1b provides a plot of a calculated band structure for a semiconductor heterostructure at zero bias according to the invention in an exemplary embodiment. In this and following figures, the dimension referred to as "growth direction" increases upward, i.e. in the direction away from the substrate.
FIG. 1c provides a plot, obtained by numerical modeling, illustrating how the transition energy and oscillator strength of intersubband transitions (ISTs) depend on the applied electric field according to the invention in an exemplary embodiment.

In an example embodiment, our device is based on the unit cell presented in FIG. 1(a), where it will be seen that the quantum-well stack 10 is enclosed between a metamaterial resonant array 12 above it (only a single unit cell of the MMR array is shown in the figure as representative of array 12) and a buried n'-doped layer 14 beneath it. It will be understood that "above" and "beneath" are defined with respect to the growth direction of the quantum-well layers. As layers are added, the device grows in the "upward" direction.

It will be seen that the individual metamaterial resonator used in the example of FIG. 1a is an H-shaped slot 16 defined in a continuous metal film. This is one of various well-known conformations for MMRs, any of which may be substituted in alternate embodiments of the invention. In particular, it should be noted that there is a complementary correspondence between resonators formed as slots in a conducting film ("negative" implementations), and resonators formed as similarly shaped metallization patterns deposited on a dielectric surface ("positive" implementations). More specifically, Babinet's principle, which is well known in the field of photonics, declares that the positive and negative implementations must have identical responses when reflectance is replaced by transmittance. Both positive and negative implementations are useful. For example, positive implementations may be more suitable for use in notch filters, and negative implementations may be more suitable for use in passband filters. Many other applications for implementations of both kinds are also possible.

One advantage of the negative implementation used in the present example is that the top metallization layer, i.e. the MMR array 12, can be used directly as the top electrical contact. Moreover, the continuous conducting film in which the array is defined, because of its relatively large lateral extent, helps to distribute the biasing field uniformly in the lateral direction across the QW stack.

FIG. 1b provides the result of a self-consistent energy level calculation of a coupled pair of asymmetric quantum wells in which the low-bandgap material is $In_{0.53}Ga_{0.47}As$ and the high-bandgap material is $Al_{0.48}In_{0.52}As$. The lower barrier is 6 nm wide, the lower well is 9 nm wide, the intermediate barrier is 1 nm wide, and the upper well is 3.1 nm wide. The lower (i.e., the wider) well is doped n-type at a level of $1.4 \times 10^{18}$ cm$^{-3}$.

The AlInAs material system is provided as an illustrative example, and is not meant to be limiting. As will be further discussed below, other semiconductor materials may usefully be employed, particularly if other operational wavelengths are desired.

It should be noted that although electrons are the dominant carriers in all of the examples provided here, other implementations in which the dominant carriers are holes are feasible and are not to be excluded from the scope of the present invention.

The bound-state energy bands corresponding to the ground state and the first two excited states are shown in the figure. The optically active transition is between the ground state and the first excited state.

At room temperature, almost all free electrons are localized inside the wide well and at the ground state. At zero bias, the transition energy to the first excited state is 118 meV, corresponding to a transition frequency of 28.5 THz.

Via the quantum confined Stark effect, application of a negative electric field (i.e., an electric field oriented such that the force on a positive charge is downward into the semiconductor) can increase the transition energy, and application of a positive electric field can lower it. By that means it is possible to control the transition frequency of the two-level system.

We found it is possible to optimize the structure to achieve a large oscillator strength between the ground and excited states while maintaining a useful range of Stark tuning. For example, FIG. 1(c) provides results from numerical simulations showing the dependence of the transition energy and the oscillator strength on the biasing field. It will be seen that for applied fields of 0 to −100 kV/cm, the transition energy scaled linearly and the oscillator strength remained nearly constant for the entire electric field range except for fields below −2.5 kV/cm.

Those skilled in the art will understand that the Stark tuning effect may be stronger in a heterostructure that decouples the quantum well pair such that the ground state, and likewise the excited state, are confined to two separate quantum wells. However, by reducing the spatial overlap of the respective wavefunctions, such an arrangement would also reduce the oscillator strength and hence weaken the required interaction with the incident electromagnetic field.

The critical role of the oscillator strength may be understood from the following equation for the electrical permittivity of the quantum well (as a function of frequency ω) in an approximation that treats ISTs as transitions of a harmonic oscillator:

$$\varepsilon_{QW}(\omega) = \varepsilon_{InGaAs} + \frac{Ne^2}{\varepsilon_0 m^*} f_{12} \frac{1}{\omega_{12}^2 - \omega^2 + 2i\omega\delta}$$

In the preceding expression, $\varepsilon_{InGaAs}$ describes the background permittivity of the quantum well, N describes the carrier concentration, m* describes the effective carrier mass, $f_{12}$ describes the oscillator strength, $\omega_{12}$ describes the intersubband resonance frequency, and δ describes the broadening of the IST.

It will be understood that because the second term of the expression on the right-hand side of the equation describes the ability of the IST to absorb light, a low oscillator strength $f_{12}$ will result in a weak interaction with light. At $f_{12}=0$, the quantum well is reduced to its dielectric bulk properties.

In practice, the precise spatial distribution of the biasing field will be affected by such details as the type of electrical contacts (e.g. whether they are ohmic or Schottky in nature) and the distribution of electrical conductivity in the volume permeated by the field.

Previous implementations have generally been electrostatic; that is, all current transport between the upper and lower electrical contacts has been suppressed. In that case, we found that the uppermost quantum well tends to behave as a conductive layer that shields all underlying wells from the applied electric field, so that the drop in potential corresponding to the applied voltage occurs almost entirely across the uppermost quantum well.

More specifically, in the case of reverse bias carriers are depleted only from the first (i.e., uppermost) quantum well. Upon full depletion, the next sequential quantum well experiences substantially all of the remaining voltage drop, and so forth. Hence, it is possible by application of reverse bias to deplete a stack of quantum wells in individual steps or well by well, but it is not possible to tune the intersubband resonance of the entire stack simultaneously.

In the case of forward bias, charges are accumulated near the surface and increase the electron concentration in the first well. However, there again lacks a substantial electric field across the deeper-lying quantum wells.

Stark tuning in the cases of both forward and reverse bias thus suffers from a shielding problem. That is, the applied voltage between the top and bottom contacts leads only to an electric field close to the surface; quantum wells that are relatively distant from the surface are not substantially biased in the electrostatic implementations.

We found, however, that the shielding problem can be solved if a conductive path is provided so that in response to the bias voltage, an electric current can flow across the quantum wells. The ohmic losses caused by the current passing through the semiconductor can stabilize the internal electric field and lead to a homogenous voltage drop along the entire heterostructure. As a consequence, the stabilizing electric current can make it possible for the dielectric response of the quantum-well stack to be tuned uniformly and evenly.

Figure 2:
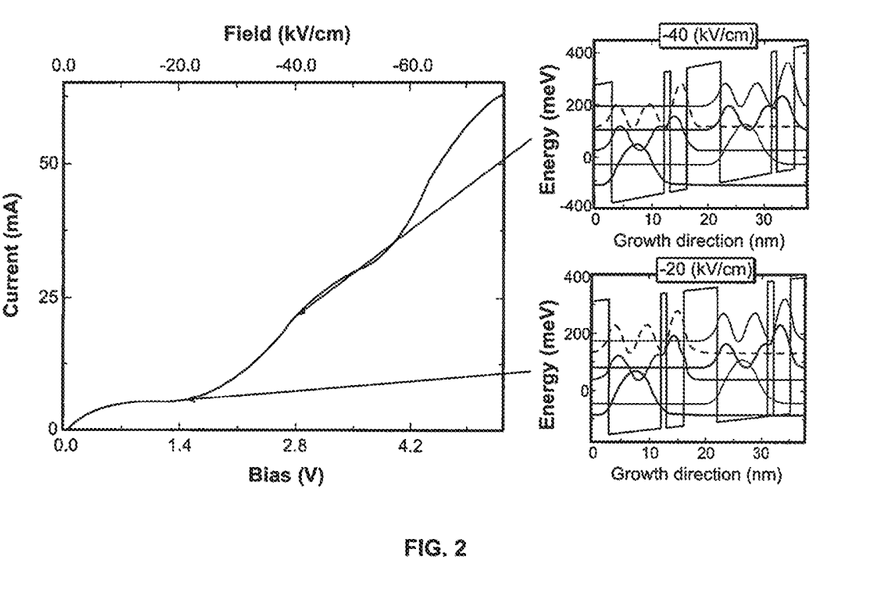

For example, FIG. 2 provides a measured current-voltage (I-V) characteristic for our exemplary heterostructure. The measurements were made on a 50×50 µm² mesa with a continuous gold top contact. There was no metamaterial patterning. Each of the several kinks in the curve corresponds to a particular subband alignment. That is, the current transport through the structure relies on tunneling between the individual subbands. The tunneling is very sensitive to the precise degree of alignment between the bands, and hence to the internal electric field. The observed kinks in the I-V traces are attributable to the alignment and misalignment of the various subbands as the bias voltage is changed.

The inset to FIG. 2 provides the results of a self-consistent band-structure calculation for a biasing field of −20 kV/cm and for a biasing field of −40 kV/cm. As indicated by the arrows in the figure, each of the resulting band structures, at its respective value of the biasing field, corresponds to one of the kinks in the I-V curve. The inset is provided for pedagogical purposes and may be understood as a qualitative indication of how the band structures at respective values of the biasing field may correspond to kinks in the I-V curve. The figure includes arrows to indicate possible such correspondences.

A stabilizing current will be sufficient if it maintains substantially constant electron density in all of the quantum wells. To prevent non-uniform fields and oscillations, it is also desirable to operate the device at biases for which the I-V curve is monotonic with a slope that is distinctly positive.

The precise range of values for an effective stabilizing current is design-dependent. As explained below, we obtained promising results with an areal current density of 2.3 kA/cm² at a bias of 5 V, which in a straight-line approximation implies a current density that rises at a rate of about 0.5 kA-cm⁻² per volt.

The current density should not be so high that it subjects the device to enough thermal stress to impair its functioning. Depending on the specific design, we believe that current densities at a bias of, e.g., 5 V can still be effective at values as low as 0.2 kA/cm² or less, and we have performed simulations that indicate that for some designs, the current density at the same bias may still be effective at values as low as 0.05 kA/cm² or even less.

On that basis we believe that in general, a conductive path in at least the material system studied here will be effective if it provides provide an areal current density that depends on voltage with a rate of change in the range of 0.005 kA-cm⁻² to 50 kA-cm⁻² per volt over at least one tuning range of the bias voltage.

The bias current depends very sensitively on the widths of the energy barriers between the coupled pairs of wells. Hence, excessively wide barriers may lead to insufficient current, or to current that does not exhibit a distinctly positive I-V curve, for reasonable levels of the bias voltage. If the barriers are too thin, the I-V behavior will be substantially ohmic, but the device might draw excessive current.

Generally speaking, a device is operating in the dynamic regime, and not in the electrostatic regime, if the transition energy is continuously tunable. Over the tuning range, the I-V curve might be linear, or it might be continuous but might have a non-linear but monotonic shape such as a quadratic shape. (Monotonicity is desirable so that the correspondence between transition energy and bias voltage will be unambiguous.) For some devices, such as continuously tunable filters, it will generally be desirable to have continuous tuning over one relatively broad tuning range. For other devices, such as switches, it may be acceptable to have continuous tuning over two or more separated tuning ranges around respective bias points.

The device conductivity is determined in large part by the doping level and by the tunneling probabilities through the quantum well stack. For a given materials system, the tunneling probabilities are dependent on the well and barrier widths not only directly, but also indirectly through their effect on the energy levels of the wells and on the degree of overlap between the energy bands of neighboring wells. Within practical limits, the doping level and the design parameters of the wells are subject to direct control. The transport properties of a given heterostructure design are readily calculated using a transport modeling code. Hence, the parameter space of a heterostructure design can be conveniently searched for an optimal design without an undue amount of experimentation.

In an example device described more completely below, we found that a barrier 6 nm in thickness, when interposed between two coupled-well pairs, almost completely decoupled the pairs from each other. Hence, further increasing the barrier would not be expected to affect the eigenstate energies. On the other hand, for very thin barriers, the quantum wells might need to be modified in an iterative procedure to compensate for changes in the barrier thickness.

In general, we expect that effective barrier layer thicknesses, at least in the material system studied here, will lie in the range 1-20 nm.

The device structure that we studied computationally and experimentally in the respective Examples 1 and 2, below, included a highly doped InGaAs bottom contact layer adjacent to the bottom of the quantum well stack, which performed as an effective ground plane. In the specific example provided below, the contact layer was formed 300 nm thick $In_{0.53}Ga_{0.47}As$ layer n+ doped to a carrier density of $3\times10^{18}$ cm⁻³.

The use of such a high doping level in the bottom conductor is not essential; in the geometry with a bottom contact, the bottom n+ layer only needs to be doped highly enough for it to serve as a bottom electrode. However, a very highly doped bottom layer can exert an optical mode-confinement effect that limits the interaction depth of the electromagnetic field of the heterostructure. Such a bottom layer can even concentrate the interactive optical mode in a thin layer where quantum wells have been formed. As a consequence, providing a highly doped semiconductor ground plane layer, e.g. a layer doped to $3\times10^{18}$ cm$^{-3}$ or more, can potentially reduce the number of periods in the quantum well heterostructure while maintaining a substantially constant level of performance.

It is particularly beneficial to combine the use of the highly doped semiconductor ground plane layer to allow for a shorter heterostructure with the use of a conducting path to alleviate the screening effect in the heterostructure as discussed earlier.

The mode-confining effects of a ground plane were described in A. Benz, S. Campione, S. Liu, I. Montano, J. F. Klem, M. B. Sinclair, F. Capolino, and I. Brener, "Monolithic metallic nanocavities for strong light-matter interaction to quantum-well intersubband excitations," Opt. Express 21 (26), 32572-32581 (2013).

Benz et al. made comparative structures similar to the structures described here, with and without a ground plane. In both structures, a positive array of dogbone-shaped MMRs was formed over an $In_{0.53}Ga_{0.47}As/Al_{0.48}In_{0.52}As$ heterostructure that was lattice-matched to an underlying InP substrate. The wells were 12.5 nm wide, and the barriers were 20 nm wide, producing a transition energy of 100 meV equivalent to a transition frequency of 24.3 THz. The quantum wells were doped to an electron sheet density of $1.25\times10^{12}$ cm$^{-2}$. The quantum wells were repeated for total thicknesses of 650 nm and 195 nm for the implementations without and with a ground plane, respectively.

In both implementations, the quantum-well stacks were capped with a 30-nm $Al_{0.48}In_{0.52}As$ layer. The ground plane was an 800-nm layer of $In_{0.53}Ga_{0.47}As$ doped to an electron density of $1\times10^{19}$ cm$^{-3}$. A 40-nm $Al_{0.48}In_{0.52}As$ barrier layer intervened between the ground plane and the bottom of the quantum well stack. In the experimental samples, the MMR array was defined by electron-beam lithography. A layer of 5 nm of titanium and 100 nm of gold was evaporatively deposited, followed by a standard lift-off process.

Finite difference time-domain (FDTD) calculations showed the normal component of the electric field of the MMRs concentrated at the metal-semiconductor interface and penetrating to a depth of about 600 nm into the structure that lacked the ground plane. By contrast, the field in the structure with the ground plane did not substantially penetrate deeper than the ground plane, and it showed a secondary concentration near the interface between the quantum well stack and the buried barrier layer.

Data from normal-incidence reflection spectra (simulations and experimental measurements were in general agreement) in both implementations exhibited two polariton branches with distinct anti-crossing behavior. The simulations predicted respective Rabi frequencies of 2.64 THz and 2.7 THz for the implementations with and without the ground plane. The corresponding Rabi frequencies derived from our experimental measurements were 2.1 THz and 2.5 THz, respectively. This result indicates that by adding the ground plane, the thickness of the quantum well stack can be reduced by a factor of three while maintaining substantially the same interaction strength between the coupled systems.

Although the embodiment of the invention described in Examples 1 and 2 below is implemented in an InGaAs/AlInAs materials system, similar principles may be applied to other materials systems, which should likewise be understood to lie within the scope and spirit of the present invention. For example, A. Benz et al., "Strong coupling in the sub-wavelength limit using metamaterial nanocavities," Nature Communications (29 Nov. 2013) 1-8, reported on the modeling and experimental investigation of a system in which MMRs were coupled to ISTs in quantum wells formed in the $Al_{0.03}Ga_{0.97}N/AlN$ system. This and other III-nitride systems are of special interest because they hold the promise of extending the resonant behavior into the near-IR region.

Benz et al. grew 40 quantum well/barrier pairs on a sapphire substrate with a 1.3-μm-thick AlN buffer layer, followed by a 4-nm-thick cap layer of the barrier material. The wells were 1.45 nm thick, and the barriers were 4.5 nm thick. The quantum wells were doped to a density of $2.32\times10^{13}$ cm$^{-2}$. The heterostructure was designed for a transition wavelength of 1.52 μm. The metamaterial was a 50-nm-thick gold pattern of positive dogbone-shaped cavities.

A series of optical transmission spectra measured for different scalings of the MMR array revealed two polariton branches exhibiting distinct anti-crossing behavior. The energy separation at resonance was 10% of the bare cavity resonant photon energy.

We believe that with appropriate variation of the design parameters, a heterostructure implemented in, e.g., the $Al_{0.03}Ga_{0.97}N/AlN$ materials system can be made with sufficient conductivity between the top and bottom electrodes to exhibit continuous tunability over at least one useful range, and can be made with a highly doped semiconductor ground plane layer sufficiently near the heterostructure to provide beneficial optical mode confinement.

As will be understood from the following Examples, we have successfully demonstrated a metamaterial device in which an MMR array is coupled to a two-level system realized by intersubband transitions in a quantum well stack. We tuned the device by applying an external bias voltage that shifted the intersubband transitions by virtue of the quantum-confined Stark effect. This approach allowed us to switch dynamically from an uncoupled to a strongly coupled system and thereby tune the metamaterial resonance over 8% of the center frequency, or over one full linewidth toward higher frequencies, with a bias of 5 V. We also observed the emergence of an additional passband at lower frequencies.

As explained above, we found that the Stark tuning of the heterostructure is most effective when electric current is permitted to pass through the quantum well region and thereby stabilize the internal electric field.

In our experimental prototype, the stabilizing current reached a density of 2.3 kA/cm$^2$ at a bias of 5 V. We believe that this current density can be reduced by making small changes in the design of the quantum-well stack. In particular, we expect that by increasing the barrier thicknesses between quantum wells, it will be possible to reduce the conductivity of the structure without changing its optical properties. By way of example, we found that increasing the barrier thickness from 6 nm to 9 nm in experimental samples reduced the current one hundredfold. It is pertinent in this regard that the conductivity depends on the tunneling probability, which in turn decreases exponentially with increases in the barrier thickness. Hence, even small changes in the barrier thickness can significantly affect the stabilizing current.

Accordingly, we believe that with design changes, currents substantially lower than those reported for the specific examples provided below will also be sufficient to stabilize the internal electric fields while achieving similar ohmic voltage drops.

EXAMPLE 1

Numerical Modeling

We performed numerical modeling of a joint MMR-IST system as represented in FIGS. 1a and 1b. In the modeled design, the quantum well stack was an $In_{0.53}Ga_{0.47}As/Al_{0.48}In_{0.52}As$ heterostructure that was lattice-matched to an InP substrate. The patterned gold metamaterial (which also served as the top contact) was processed directly on top of the semiconductor.

Deposited on top of the quantum well stack and directly underneath the gold contact was a highly doped n+ layer 20 nm thick and doped to a carrier density of $3\times10^{18}$ cm$^{-3}$. The purpose of this layer was to reduce the Schottky voltage at the semiconductor-gold interface and to improve the homogeneity of the electric field distribution within the patterned air hole of each MMR.

With a lattice constant of 2.625 μm, the metamaterial had a resonant frequency of 29.6 THz. As is well-known in the art, the resonant frequency and linewidth also depend on the shape and dimensions of the air holes in the patterned gold metamaterial. In our exemplary implementation, the air holes had the following dimensions: For each of the two parallel paddles, 900 nm×200 nm; for the center bar, 550 nm×100 nm.

One full period of the growth sequence for the heterostructure consisted of, from the bottom: 6-nm barrier layer of AlInAs; 9-nm well layer of InGaAs n-doped to $1.4\times10^{18}$ cm$^{-3}$; 1-nm barrier layer of AlInAs; 3.1-nm well layer of InGaAs.

The bottom contact was formed by a 300-nm $In_{0.53}Ga_{0.47}As$ layer n+ doped to a carrier density of $3\times10^{18}$ cm$^{-3}$. The external bias was applied between the metamaterial and the n$^+$ bottom contact layer.

FIG. 1b provides the result of a self-consistent bandstructure calculation for the semiconductor heterostructure at zero bias using a Schroedinger-Poisson solver. The fundamental optical transition occurs between the ground state (lowest curve) and the first excited state (next lowest curve).

FIG. 1c provides a plot of the dependence of the transition energy and the oscillator strength on the applied electric bias field. It will be seen that the transition energy scales linearly between field strengths of 0 and −100 kV/cm. It will be seen that the oscillator strength remains nearly constant for the entire electric field range except for fields below −2.5 kV/cm.

We modeled the optical reflectance of the joint system at normal incidence in the far field, at zero applied bias voltage, using a commercial finite-difference time-domain (FDTD) electromagnetic solver. The IST was modeled as an anisotropic harmonic oscillator subject to the in-plane dipole selection rules, which require that only light polarized along the quantum-well growth direction can couple to ISTs in $In_{0.53}Ga_{0.47}As/Al_{0.48}In_{0.52}As$ heterostructures.

The alert reader might observe that the electric field polarization of normally incident light has no z-component and therefore by itself will not couple to the quantum well intersubband transitions. The interaction of the light with the MM creates an electric field in the z-direction close to the MM film which allows the light to couple to the IST as well. That is, most of the incident optical field is transferred in the near-field region of the MMRs to the perpendicular field component at the metamaterial resonance.

In our simulations, we varied the size of the MMR so as to geometrically scale its resonant frequency. We thus created a sweep of the MMR resonance across the ISR resonance, which was fixed at about 28.5 THz. We calculated a series of normal-incidence reflectance spectra of the device for a range of bare cavity resonances, i.e. the resonant frequencies of the metamaterial without the quantum wells, from about 22 THz to about 35 THz. The result is shown in FIG. 3a.

Figure 3A:
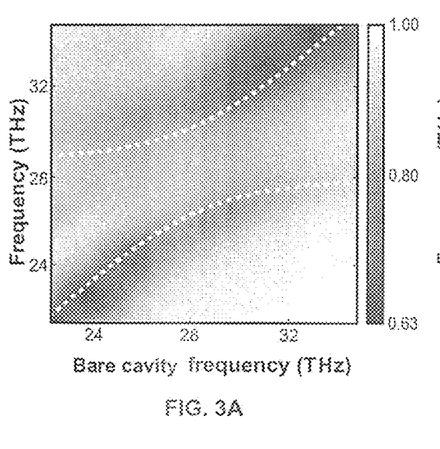

Turning now to FIG. 3a, it will be seen that two polariton branches have emerged, and that they exhibit a distinct anti-crossing behavior. The polaritons have eigenfrequencies that occur at the reflectance minima. The anti-crossing behavior is best seen in FIG. 3a, where we have plotted the reflectance minima as a function of the bare cavity resonances.

The splitting between the polariton branches is most apparent where the bare metamaterial resonance coincides with the IST resonance. In place of a single strong peak, there appear two peaks that are shifted from their unperturbed eigenfrequencies to respective higher and lower values.

The energy separation between the two polariton branches in the resonant case is $2\hbar\Omega_R$, where $\Omega_R$ is the Rabi frequency for energy exchange between an optical cavity and a two-level system to which it is strongly coupled. In the present calculations, the closest approach between the two branches occurs at a bare cavity resonance of 28.5 THz, which corresponds to the intersubband resonance at zero bias.

EXAMPLE 2

Experimental

We fabricated exemplary devices in substantial accordance with the design described above. The heterostructures were grown by molecular beam epitaxy (MBE). To facilitate the application of the bias voltage, we defined mesas by wet-chemical etching. The bottom contact was processed as a GeAu—Ni—Au ohmic contact directly on top of the n$^+$ doped layer and was annealed at 320° C. for 60 s.

To provide data for a scan of the bare cavity frequency, we fabricated a series of metamaterials with different geometric scaling factors on top of the same heterostructure. In brief, the main processing steps for fabricating the metamaterials were as follows: (1) Spin photoresist on top of wafer. (2) Illuminate metamaterial pattern with electron beam. (3) Develop photoresist. (4) Evaporate Ti/Au onto the entire sample. (5) Perform metal lift-off to remove excess metal.

We measured the room-temperature reflectances of individual metamaterial devices with respective values of the bare cavity resonance.

Figure 3B:
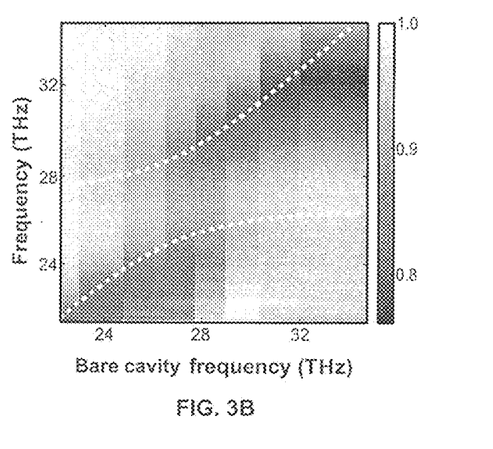
FIG. 3b provides an experimentally measured normal-incidence reflectance spectrum at zero bias, corresponding to the theoretical spectrum of FIG. 3a. The experimental spectrum was measured at discrete values of the bare cavity frequency. As in FIG. 3a, a pair of dashed lines is included to represent the predicted polariton eigenfrequencies.

FIG. 3b provides the experimentally measured normal-incidence reflectance spectrum at zero bias, for a series of samples having respective discrete values of the bare cavity frequency. The center of each tile along the horizontal axis corresponds to the bare cavity frequency of the fabricated metamaterial. The measured intersubband resonance was approximately 5% lower than predicted by our band-structure calculations. This shift is included in the predicted polariton eigenfrequency curves that are visible as dashed lines in the figure.

Our measurements agreed well with our simulated reflectance curves. The measured modulation depth was less than the simulations predicted. We attribute the discrepancy to a large spread of incoming angles, due to our use of an objective of 0.58 NA in the reflectance experiments. Our simulations, on the other hand, were performed for plane waves at normal incidence.

We observed the effects of voltage tuning on a metamaterial with a simulated bare cavity resonance of 29.6 THz. Directing the applied voltage such that the top contact was positive relative to the bottom contact resulted in a negative electric field across the quantum-well stack. By increasing the applied voltage, we shifted the intersubband resonance toward higher frequencies and thereby tuned it into resonance with the metamaterial.

Figure 4:
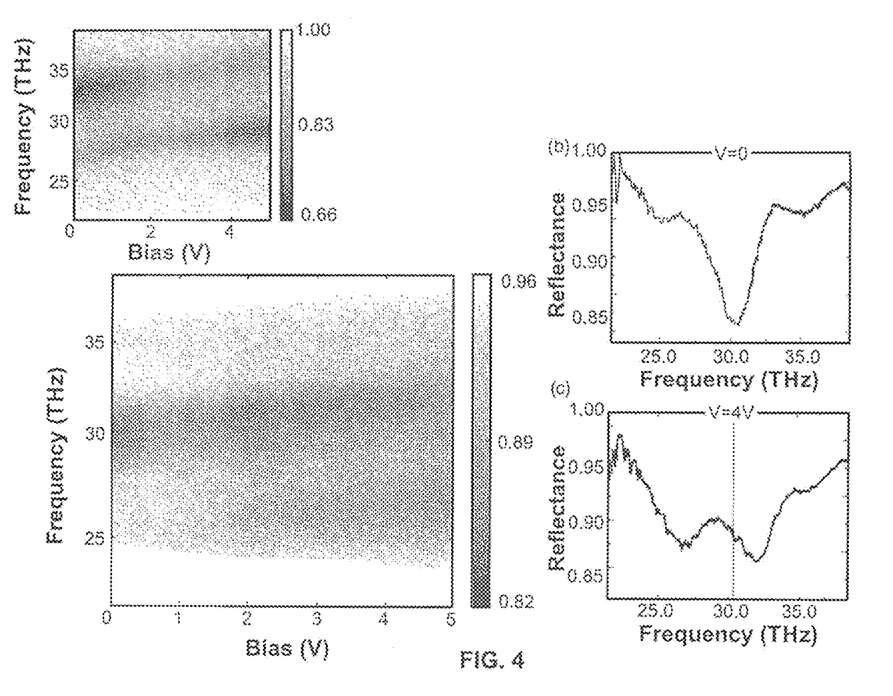

FIG. 4 provides the resulting spectrum, plotted as a function of the applied bias voltage. For comparison, the inset to the figure shows calculated reflectance spectra that were derived from numerical simulations.

As explained above, anti-crossing behavior emerges as the metamaterial resonance frequency approaches the intersubband resonance frequency. As seen in the figure, a reflectance minimum, due to the IST, begins to appear when the bias voltage reaches 2.5 V.

Both the IST resonance and the MMR resonance are seen to shift toward higher frequencies as the bias voltage increases. This behavior is even more clearly shown in the detailed sections of FIG. 4 for respective biases of 0 V and 4 V.

When the bare cavity resonance and the IST have a similar uncoupled resonance frequency (which happens around 4 V), the two polariton branches are detuned from their natural resonance frequencies to respective higher and lower values, with a region of increased reflectivity lying between them.

We found that a bias of 5 V was effective to shift the metamaterial resonance (here the upper polariton branch) by one full linewidth of the IST (corresponding to 8% of the center frequency) toward higher frequencies. The reflectance minimum observed at 30.5 THz for zero bias was thereby transformed to a reflectance maximum.

What is claimed is:

1. A photonic apparatus, comprising:
   a vertically stacked plurality of quantum wells defined in a semiconductor body;
   a metamaterial resonator array overlying and electromagnetically coupled to the quantum-well stack; and
   electrical contacts arranged to apply, in operation, a bias voltage across the quantum well stack;
   wherein the apparatus is tunable by varying the bias voltage;
   wherein the quantum-well stack is adapted to provide, in operation, a conductive path for electric current between the electrical contacts; and
   wherein the quantum-well stack comprises alternating layers of $In_{0.53}Ga_{0.47}As$ and $Al_{0.48}In_{0.52}As$ or the quantum-well stack comprises alternating layers of $Al_{0.03}Ga_{0.97}N$ and AlN.

2. The apparatus of claim 1, further comprising a doped semiconductor contact layer situated on a side of the quantum-well stack distal the metamaterial resonator array and having sufficient carrier density to behave substantially as a ground plane to electromagnetic excitations of the metamaterial resonator array.

3. The apparatus of claim 1, wherein the conductive path is so conformed that the electric current varies continuously and monotonically with the bias voltage over at least one tuning range.

4. The apparatus of claim 1, wherein the conductive path is adapted to provide an areal current density that depends on voltage with a rate of change in the range of 0.005 $kA\text{-}cm^{-2}$ to 50 $kA\text{-}cm^{-2}$ per volt over at least one tuning range of the bias voltage.

5. The apparatus of claim 1, wherein the quantum-well stack comprises alternating layers of $In_{0.53}Ga_{0.47}As$ and $Al_{0.48}In_{0.52}As$.

6. The apparatus of claim 1, wherein the quantum-well stack comprises alternating layers of $Al_{0.03}Ga_{0.97}N$ and AlN.

7. The apparatus of claim 2, wherein the ground plane layer is adapted to create, in operation, a mode-confinement region underlying the metamaterial resonator array, and wherein the quantum-well stack is substantially positioned within the mode-confinement region.

8. The apparatus of claim 1, wherein:
   the quantum-well stack comprises a plurality of mutually coupled quantum-well pairs;
   the respective quantum-well pairs are separated from each other by barrier layers;
   each quantum well is defined by a layer of $In_{0.53}Ga_{0.47}As$ and each barrier layer is defined by a layer of $Al_{0.48}In_{0.52}As$; and
   each barrier layer that separates a pair of quantum-well layers has a thickness in the range 1-20 nm.

9. The apparatus of claim 8, further comprising a doped semiconductor contact layer of $In_{0.53}Ga_{0.47}As$ situated on a side of the quantum-well stack distal the metamaterial resonator array and having sufficient carrier density to behave substantially as a ground plane to electromagnetic excitations of the metamaterial resonator array.

10. The apparatus of claim 9, wherein the ground plane layer is n+ doped at a dopant density of at least $3 \times 10^{18}$ $cm^{-3}$.

11. A method for operating a photonic device, comprising:
   impinging a light beam on a planar metamaterial resonator (MMR) array that overlies a quantum-well stack wherein the quantum-well stack comprises alternating layers of $In_{0.53}Ga_{0.47}As$ and $Al_{0.48}In_{0.52}As$ or the quantum-well stack comprises alternating layers of $Al_{0.03}Ga_{0.97}N$ and AlN;
   applying to the device a bias voltage effective to cause an electric current to flow through the quantum well stack; and
   while flowing the current, varying the bias voltage so as to change a spectral transmission or reflection response of the MMR array.

12. The method of claim 11, wherein the bias voltage is varied within at least one specified tuning range.

13. The method of claim 12, wherein the transmission or reflection response is continuously adjustable over the tuning range.

14. The method of claim 12, wherein the tuning range includes a polariton anti-crossing region of the photonic device.

15. The method of claim 12, wherein the current flow depends continuously and monotonically on the bias voltage over the tuning range.

16. The method of claim 11, wherein the current flow is effective to maintain substantially constant electron density in all quantum wells of the quantum-well stack.

17. The method of claim 11, wherein:
   the quantum-well stack has an inherent resonant frequency that it would exhibit if it were not coupled to the MMR array;
   the MMR array has an inherent resonant frequency that it would exhibit if it were not coupled to the quantum-well stack;
   the bias voltage is effective in at least one tuning range for Stark tuning the resonant frequency of the quantum-well stack; and
   the varying of the bias voltage is performed so as to bring the inherent resonant frequency of the quantum-well stack into or out of coincidence with the inherent resonant frequency of the MMR array.

* * * * *